(12) United States Patent
Ko

(10) Patent No.: US 10,673,418 B2
(45) Date of Patent: Jun. 2, 2020

(54) LEVEL SHIFTER CIRCUIT

(71) Applicant: SAMSUNG ELECTRONICS CO., LTD., Suwon-si (KR)

(72) Inventor: Seokkyun Ko, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 74 days.

(21) Appl. No.: 15/980,236

(22) Filed: May 15, 2018

(65) Prior Publication Data

US 2019/0173455 A1 Jun. 6, 2019

(30) Foreign Application Priority Data

Dec. 5, 2017 (KR) .................. 10-2017-0165793

(51) Int. Cl.
*H03K 3/017* (2006.01)
*H03K 3/356* (2006.01)
*H03K 19/0185* (2006.01)

(52) U.S. Cl.
CPC ....... *H03K 3/017* (2013.01); *H03K 3/356113* (2013.01); *H03K 19/018521* (2013.01)

(58) Field of Classification Search
CPC .......... H03K 3/017; H03K 3/02; H03K 3/353; H03K 3/356; H03K 3/356104; H03K 3/356113

See application file for complete search history.

(56) References Cited

U.S. PATENT DOCUMENTS

| | | | |
|---|---|---|---|
| 7,119,600 | B2 | 10/2006 | Chen |
| 7,205,820 | B1 | 4/2007 | Yeung et al. |
| 7,456,662 | B2 | 11/2008 | Okamura |
| 7,554,361 | B2 | 6/2009 | Kim et al. |
| 7,808,294 | B1 * | 10/2010 | Kottapalli ........ H03K 3/356113 326/68 |
| 7,965,123 | B2 | 6/2011 | Su |
| 8,004,311 | B2 | 8/2011 | Kim et al. |
| 8,705,219 | B2 | 4/2014 | Jeon et al. |
| 8,773,831 | B2 | 7/2014 | Onishi et al. |
| 8,860,487 | B2 | 10/2014 | Ma |

(Continued)

*Primary Examiner* — Lincoln D Donovan
*Assistant Examiner* — Diana J. Cheng
(74) *Attorney, Agent, or Firm* — Sughrue Mion, PLLC

(57) ABSTRACT

A level shifter circuit is provided. The level shifter circuit includes a first voltage-based input circuit configured to generate a first voltage-based inverted voltage and a first voltage-based non-inverted voltage based on an input voltage having a first voltage as a first peak voltage; a pull-up circuit configured to generate a second voltage-based first current corresponding to the first voltage-based non-inverted voltage, generate a second voltage-based pull-up current based on the second voltage-based first current, and pull up an output voltage according to the second voltage-based pull-up current when the first voltage-based non-inverted voltage increases; and a pull-down circuit configured to generate a second voltage-based second current corresponding to the first voltage-based inverted voltage, generate a second voltage-based pull-down current based on the second voltage-based second current, and pull down the output voltage according to the second voltage-based pull-down current when the first voltage-based inverted voltage increases.

19 Claims, 8 Drawing Sheets

(56) References Cited

U.S. PATENT DOCUMENTS

| | | |
|---|---|---|
| 8,901,964 B2 | 12/2014 | Luo |
| 2011/0260753 A1 | 10/2011 | Srivastava et al. |
| 2012/0268187 A1* | 10/2012 | Kimoto ............ H03K 3/356069 |
| | | 327/328 |

* cited by examiner

LEVEL SHIFTER CIRCUIT

CROSS-REFERENCE TO RELATED APPLICATION

This application claims priority from Korean Patent Application No. 10-2017-0165793, filed on Dec. 5, 2017 with the Korean Intellectual Property Office, the content of which is incorporated herein by reference in its entirety.

BACKGROUND

1. Field

Methods and apparatuses consistent with example embodiments relate to a level shifter circuit.

2. Related Art

A level shifter circuit is a circuit configured to shift a level of an input voltage to generate an output voltage having a shifted level. The level shifter circuit may function as an interface between circuits operated by power supply voltages having different levels. Accordingly, electronic apparatuses including circuits operated by power supply voltages having different levels need level shifter circuits configured to shift one level of power supply voltage to another level of power supply voltage or a specific level of power supply voltage.

SUMMARY

One or more example embodiments provide a level shifter circuit in which waveform distortion and duty ratio distortion of an output value, such as an output voltage or an output signal, may be reduced by reducing skew between pull-up and pull-down.

According to an aspect of an example embodiment, there is provided a level shifter circuit including a first voltage-based input circuit configured to generate a first voltage-based inverted voltage and a first voltage-based non-inverted voltage based on an input voltage having a first voltage as a first peak voltage; a pull-up circuit configured to generate a second voltage-based first current corresponding to the first voltage-based non-inverted voltage, generate a second voltage-based pull-up current based on the second voltage-based first current, and pull up an output voltage according to the second voltage-based pull-up current in a first state in which the first voltage-based non-inverted voltage increases; and a pull-down circuit configured to generate a second voltage-based second current corresponding to the first voltage-based inverted voltage, generate a second voltage-based pull-down current based on the second voltage-based second current, and pull down the output voltage according to the second voltage-based pull-down current in a second state in which the first voltage-based inverted voltage increases.

According to an aspect of another example embodiment, there is provided a level shifter circuit, including: a first voltage-based input circuit configured to generate an inverted signal and a non-inverted signal based on an input signal having a first voltage as a first peak voltage; a first semiconductor device configured to receive the non-inverted signal through a first semiconductor device gate terminal and generate a first signal based on the non-inverted signal through a first semiconductor device drain terminal and a first semiconductor device source terminal; a second semiconductor device configured to receive the inverted signal through a second semiconductor device gate terminal and generate a second signal based on the inverted signal through a second semiconductor device drain terminal and a second semiconductor device source terminal; and a second voltage-based output circuit configured to generate a first mirror signal of the first signal and a second mirror signal of the second signal at least once and generate an output signal having a second voltage having a second peak voltage higher than the first peak voltage by collecting the first mirror signal and the second mirror signal.

According to an aspect of yet another example embodiment, there is provided a level shifter circuit, including: a first voltage-based input circuit configured to generate a first voltage-based inverted voltage and a first voltage-based non-inverted voltage based on input voltage; a pull-up circuit configured to generate a second voltage-based first current corresponding to the first voltage-based inverted voltage, generate a second voltage-based pull-up current based on the second voltage-based first current, and pull up an output voltage according to the second voltage-based pull-up current in a first state in which the first voltage-based inverted voltage decreases; and a pull-down circuit configured to generate a second voltage-based second current corresponding to the first voltage-based non-inverted voltage, generate a second voltage-based pull-down current based on the second voltage-based second current, and pull down the output voltage according to the second voltage-based pull-down current in a second state in which the first voltage-based non-inverted voltage decreases.

BRIEF DESCRIPTION OF DRAWINGS

The above and other aspects, features, and advantages will be more clearly understood from the following detailed description taken in conjunction with the accompanying drawings, in which.

DETAILED DESCRIPTION

Hereinafter, aspects of semiconductor devices consistent with example embodiments will be described with reference to the accompanying drawings.

Figure 1:
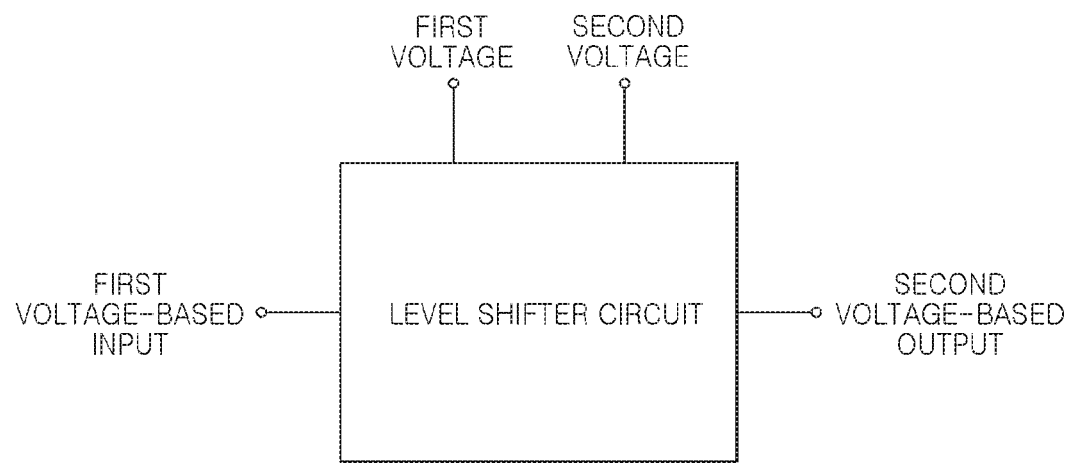
FIG. 1 is a block diagram illustrating a level shifter circuit according to an example embodiment.

FIG. 1 is a block diagram illustrating a level shifter circuit according to an example embodiment.

Referring to FIG. 1, the level shifter circuit may shift a first voltage-based input value (e.g., an input voltage and an input signal) to a second voltage-based output value (e.g., an output voltage and an output signal).

A voltage of the first voltage-based input value may be between a first voltage (e.g., 0.75 V), and a low voltage (e.g., 0 V). For example, the first voltage-based input value may be a square wave signal oscillating between the first voltage and the low voltage, or a sinusoidal wave signal or triangular wave signal having the first voltage as a peak voltage.

A voltage of the second voltage-based output value may be between a second voltage (e.g., 1.1 V, 1.2 V, or 1.5 V) and a low voltage (e.g., 0 V). For example, the second voltage-based output value may be a square wave signal oscillating between the second voltage and the low voltage, or a sinusoidal wave signal or triangular wave signal having the second voltage as a peak voltage.

The level shifter circuit may output the second voltage-based output value based on the first voltage-based input value. That is, the voltage of the second voltage-based output value may increase in response to rising of the voltage of the first voltage-based input value, and decrease in response to falling of the voltage of the first voltage-based input value.

The level shifter circuit may receive the first voltage from a first power supply and the second voltage from a second power supply. According to an example embodiment, the first and second power supplies may be combined into a single power supply. The level shifter circuit may pull up and pull down the voltage of the second voltage-based output value using the first power supply and the second power supply, and thereby enable the rising and falling of the voltage of the second voltage-based output value to correspond to the rising and falling of the voltage of the first voltage-based input value.

When the pull-up and pull-down of the level shifter circuit are mutually imbalanced, a waveform of the second voltage-based output value may be distorted compared to the first voltage-based input value.

For example, when the rising of the voltage of the second voltage-based output value is slower than the falling of the voltage of the second voltage-based output value, the average voltage of the second voltage-based output value may be lowered. Here, when the first voltage-based input value has a square waveform, the second voltage-based output value may be distorted to have a trapezoidal waveform, and the second voltage-based output value may have a lower duty ratio than the first voltage-based input value. In addition, when the first voltage-based input value has a high frequency, the distortion in the waveform and duty ratio of the second voltage-based output value may become severe.

Accordingly, level shifter circuits consistent with example embodiments may improve a skew between the pull-up and the pull-down of the second voltage-based output value, and reduce the distortion of the waveform and duty ratio of the second voltage-based output value.

Figure 2:
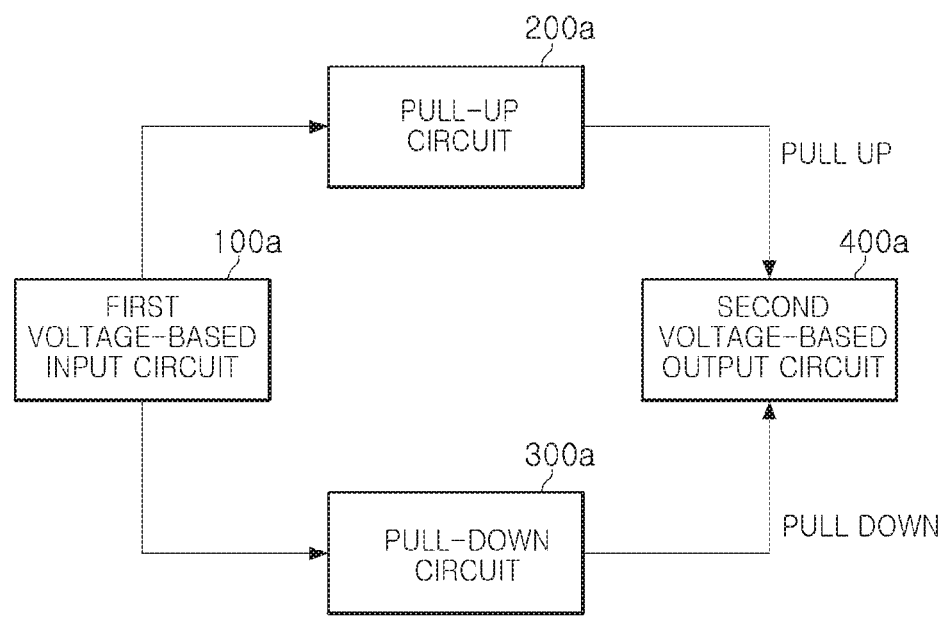
FIG. 2 is a block diagram illustrating a level shifter circuit according to an example embodiment.

FIG. 2 is a block diagram illustrating a level shifter circuit according to an example embodiment.

Referring to FIG. 2, the level shifter circuit may include a first voltage-based input circuit 100a, a pull-up circuit 200a, and a pull-down circuit 300a. In addition, the level shifter circuit may further include a second voltage-based output circuit 400a.

The first voltage-based input circuit 100a may generate a first voltage-based inverted voltage and a first voltage-based non-inverted voltage from an input voltage.

The second voltage-based output circuit 400a may output an output voltage.

The pull-up circuit 200a may generate a second voltage-based first current corresponding to the first voltage-based non-inverted voltage, generate a second voltage-based pull-up current based on the second voltage-based first current, and pull up the output voltage according to the second voltage-based pull-up current when the first voltage-based non-inverted voltage increases.

The pull-down circuit 300a may generate a second voltage-based second current corresponding to the first voltage-based inverted voltage, generate a second voltage-based pull-down current based on the second voltage-based second current, and pull down the output voltage according to the second voltage-based pull-down current when the first voltage-based inverted voltage increases.

The first voltage-based non-inverted voltage used in the pull-up circuit 200a may correspond to the first voltage-based inverted voltage used in the pull-down circuit 300a.

The second voltage-based first current generated in the pull-up circuit 200a may correspond to the second voltage-based second current generated in the pull-down circuit 300a.

The second voltage-based pull-up current generated in the pull-up circuit 200a may correspond to the second voltage-based pull-down current generated in the pull-down circuit 300a.

Accordingly, the pull-up in the pull-up circuit 200a and the pull-down of the pull-down circuit 300a may be mutually balanced.

According to example embodiments, the pull-up circuit 200a may use the first voltage-based inverted voltage instead of the first voltage-based non-inverted voltage, and pull up the output voltage according to the second voltage-based pull-up current when the first voltage-based inverted voltage decreases. Likewise, the pull-down circuit 300a may use the first voltage-based non-inverted voltage instead of the first voltage-based inverted voltage, and pull down the output voltage according to the second voltage-based pull-down current when the first voltage-based non-inverted voltage decreases. Here, n-type semiconductor devices of the pull-up circuit 200a and the pull-down circuit 300a may be replaced by p-type semiconductor devices, and p-type semiconductor devices thereof may be replaced by n-type semiconductor devices.

Figure 3:
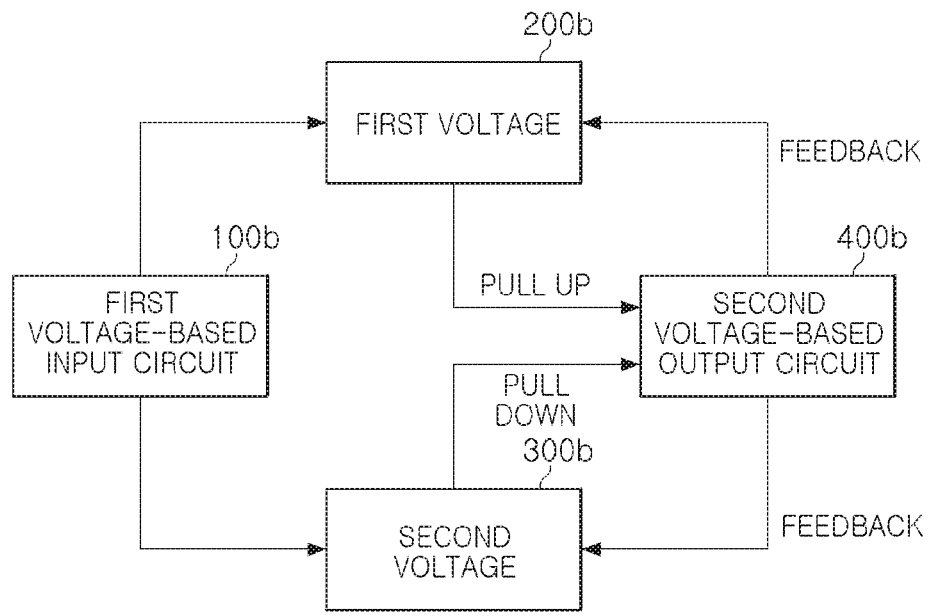
FIG. 3 is a block diagram illustrating a level shifter circuit according to another example embodiment.

FIG. 3 is a block diagram illustrating a level shifter circuit according to another example embodiment.

Referring to FIG. 3, the level shifter circuit may include a first voltage-based input circuit 100b, a pull-up circuit 200b, a pull-down circuit 300b, and a second voltage-based output circuit 400b.

The first voltage-based input circuit 100b may generate an inverted signal and a non-inverted signal from an input signal having a first voltage as a peak voltage.

The pull-up circuit 200b may include a first semiconductor device receiving the non-inverted signal through a gate terminal thereof and generating a first signal based on the non-inverted signal through a drain terminal or source terminal thereof.

The pull-down circuit 300b may include a second semiconductor device receiving the inverted signal through a gate terminal thereof and generating a second signal based on the inverted signal through a drain terminal or source terminal thereof.

The second voltage-based output circuit 400b may mirror the first signal and the second signal at least once, and generate an output signal having a second voltage, higher than the first voltage, as a peak voltage by collecting the mirrored first signal and the mirrored second signal.

That is, the level shifter circuit may mirror both of the first signal and the second signal, thereby balancing the pull-up and the pull-down of the first and second signals.

The second voltage-based output circuit 400b may feedback the output signal to the pull-up circuit 200b and the pull-down circuit 300b. Accordingly, the balance between the pull-up and the pull-down of the first and second signals may be further improved in the level shifter circuit.

Figure 4:
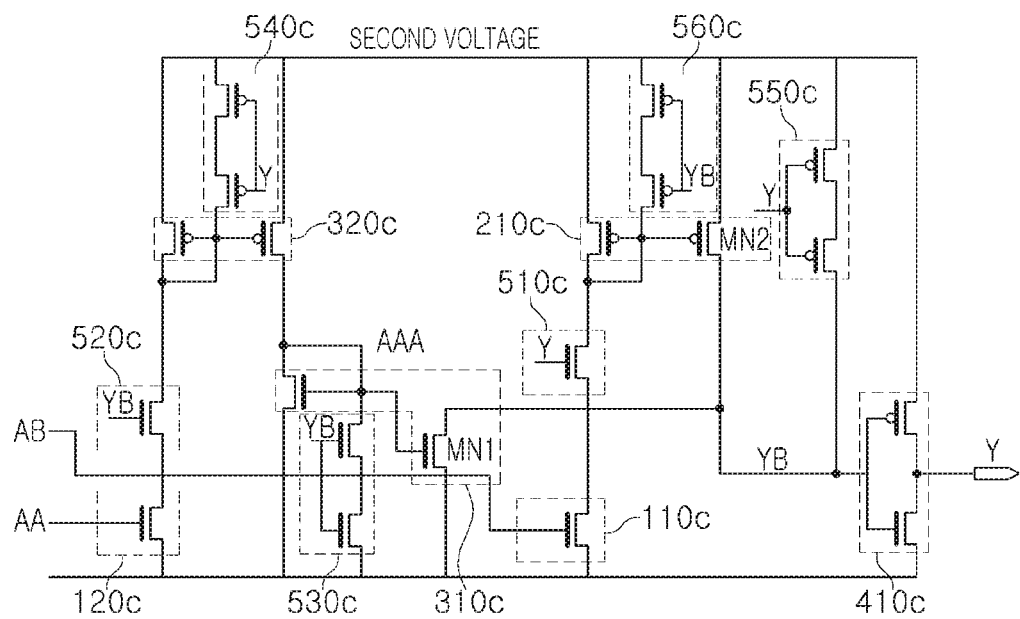
FIG. 4 is a circuit diagram illustrating a level shifter circuit according to an example embodiment.

FIG. 4 is a circuit diagram illustrating a level shifter circuit according to an example embodiment.

Referring to FIG. 4, the level shifter circuit may include at least one of a second semiconductor device 110c, a first semiconductor device 120c, a second current mirror circuit 210c, a third current mirror circuit 310c, a first current mirror circuit 320c, a second voltage-based inverter 410c, a second feedback circuit 510c, a first feedback circuit 520c, a third switch circuit 530c, a first switch circuit 540c, a fourth switch circuit 550c, and a second switch circuit 560c.

Hereinafter, a process in which a pull-up circuit pulls up an output voltage Y will be described.

The first semiconductor device 120c may receive a first voltage-based non-inverted voltage AA through a gate terminal thereof. The first semiconductor device 120c may generate a first current flowing between a drain terminal and a source terminal of the first semiconductor device 120c according to the first voltage-based non-inverted voltage AA.

When the first voltage-based non-inverted voltage AA increases, the first current may increase.

The first current mirror circuit 320c may generate a third current by mirroring the first current.

The third current mirror circuit 310c may generate a second voltage-based pull-up current by mirroring the third current.

The second voltage-based pull-up current may increase corresponding to the first current. Accordingly, a voltage of a drain terminal of a pull-up semiconductor device MN1 included in the third current mirror circuit 310c may decrease.

The second voltage-based inverter 410c may invert the voltage of the drain terminal of the pull-up semiconductor device MN1. Accordingly, the output voltage Y may increase.

Hereinafter, a process in which a pull-down circuit pulls down the output voltage Y will be described.

The second semiconductor device 110c may receive a first voltage-based inverted voltage AB through a gate terminal thereof. The second semiconductor device 110c may generate a second current flowing between a drain terminal and a source terminal thereof according to the first voltage-based inverted voltage AB.

When the first voltage-based inverted voltage AB increases, the second current may increase.

The second current mirror circuit 210c may generate a second voltage-based pull-down current by mirroring the second current.

The second voltage-based pull-down current may increase corresponding to the second current. Accordingly, a voltage of a drain terminal of a pull-down semiconductor device MN2 included in the second current mirror circuit 210c may increase.

The second voltage-based inverter 410c may invert the voltage of the drain terminal of the pull-down semiconductor device MN2. Accordingly, the output voltage Y may decrease.

The pull-down circuit may support the pull-up circuit pulling up the output voltage Y.

That is, the second switch circuit 560c may receive an inverted output voltage YB as a feedback through a gate terminal thereof, and supply a second voltage to an input node of the second current mirror circuit 210c in a state in which the inverted output voltage YB decreases. The voltage of the drain terminal of the pull-down semiconductor device MN2 may decrease as a voltage of a gate terminal of the pull-down semiconductor device MN2 substantially increases to the second voltage. Accordingly, a more powerful pull-down force may be applied to the inverted output voltage YB and a more powerful pull-up force may be applied to the output voltage Y.

The second feedback circuit 510c may receive the output voltage Y as a feedback through a gate terminal thereof, and increase a voltage of the input node of the second current mirror circuit 210c in a state in which the output voltage Y increases. Accordingly, the pull-down semiconductor device MN2 may increase a pull-down force applied to the inverted output voltage YB. Accordingly, a more powerful pull-down force may be applied to the inverted output voltage YB, and a more powerful pull-up force may be applied to the output voltage Y.

The pull-up circuit may support the pull-down circuit pulling down the output voltage Y.

That is, the first switch circuit 540c may receive the output voltage Y as a feedback through a gate terminal thereof, and supply the second voltage to an input node of the first current mirror circuit 320c in a state in which the output voltage Y decreases. Accordingly, the third current may decrease, and the voltage of the drain terminal of the pull-up semiconductor device MN1 may increase. Accordingly, a more powerful pull-up force may be applied to the inverted output voltage YB, and a more powerful pull-down force may be applied to the output voltage Y.

The third switch circuit 530c may receive the inverted output voltage YB as a feedback through a gate terminal thereof, and supply a low voltage to an input node AAA of the third current mirror circuit 310c in a state in which the inverted output voltage YB increases. Accordingly, the third current may decrease, and the voltage of the drain terminal of the pull-up semiconductor device MN1 may increase. Accordingly, a more powerful pull-up force may be applied to the inverted output voltage YB, and a more powerful pull-down force may be applied to the output voltage Y.

The first feedback circuit 520c may receive the inverted output voltage YB as a feedback through a gate terminal thereof, and increase a voltage of the input node of the first current mirror circuit 320c in a state in which the inverted output voltage YB increases. Accordingly, the pull-up semiconductor device MN1 may increase a pull-up force applied to the inverted output voltage YB. Accordingly, a more powerful pull-up force may be applied to the inverted output voltage YB, and a more powerful pull-down force may be applied to the output voltage Y.

The fourth switch circuit 550c may receive the output voltage Y as a feedback through a gate terminal thereof, and supply the second voltage to an input node of the second voltage-based inverter 410c in a state in which the output voltage Y decreases. Accordingly, a more powerful pull-up force may be applied to the inverted output voltage YB, and a more powerful pull-down force may be applied to the output voltage Y.

According to an example embodiment, the n-type semiconductor device illustrated in FIG. 4 may be replaced by a p-type semiconductor device, and the p-type semiconductor device illustrated in FIG. 4 may be replaced by an n-type semiconductor device.

Figure 5:
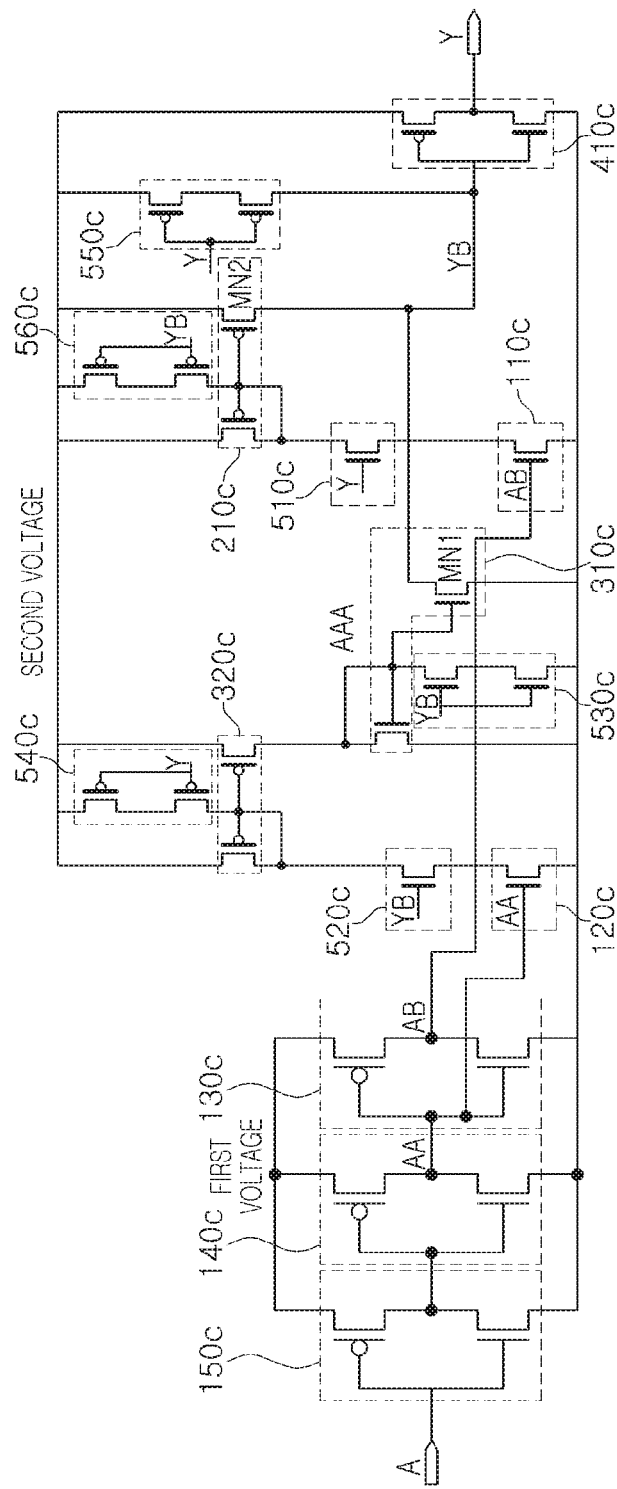
FIG. 5 is a circuit diagram illustrating a level shifter circuit according to another example embodiment.

FIG. 5 is a circuit diagram illustrating a level shifter circuit according to another example embodiment.

Referring to FIG. 5, the level shifter circuit may include at least one of a second semiconductor device 110c, a first semiconductor device 120c, a third inverter 130c, a second inverter 140c, a first inverter 150c, a second current mirror circuit 210c, a third current mirror circuit 310c, a first current mirror circuit 320c, a second voltage-based inverter 410c, a second feedback circuit 510c, a first feedback circuit 520c, a third switch circuit 530c, a first switch circuit 540c, a fourth switch circuit 550c, and a second switch circuit 560c.

The first inverter 150c may generate an inverted input voltage by inverting an input voltage.

The second inverter 140c may generate a first voltage-based non-inverted voltage AA by inverting the inverted input voltage.

The third inverter 130c may generate a first voltage-based inverted voltage AB by inverting the first voltage-based non-inverted voltage AA.

The first, second, and third inverters 150c, 140c, and 130c may receive a power supply having a first voltage lower than a second voltage. Accordingly, threshold voltages of semiconductor devices of the first, second, and third inverters 150c, 140c, and 130c may be lower than threshold voltages of the semiconductor devices illustrated in FIG. 4, and gate thicknesses of the semiconductor devices of the first, second, and third inverters 150c, 140c, and 130c may be smaller than gate thicknesses of the semiconductor devices illustrated in FIG. 4.

The pull-up time of the first voltage-based non-inverted voltage AA may be delayed more than the pull-down time of the first voltage-based inverted voltage AB. Accordingly, the arrangement order of the first, second, and third inverters 150c, 140c, and 130c may be set in such a manner that the first voltage-based inverted voltage AB comes behind the first voltage-based non-inverted voltage AA.

Accordingly, an interval between the pull-up time of the output voltage Y according to rising of an input voltage A and the pull-down time of the output voltage Y according to falling of the input voltage A may decrease. The time interval may be optimized by adding an inverter or a buffer between the second inverter 140c and the third inverter 130c.

Figure 6:
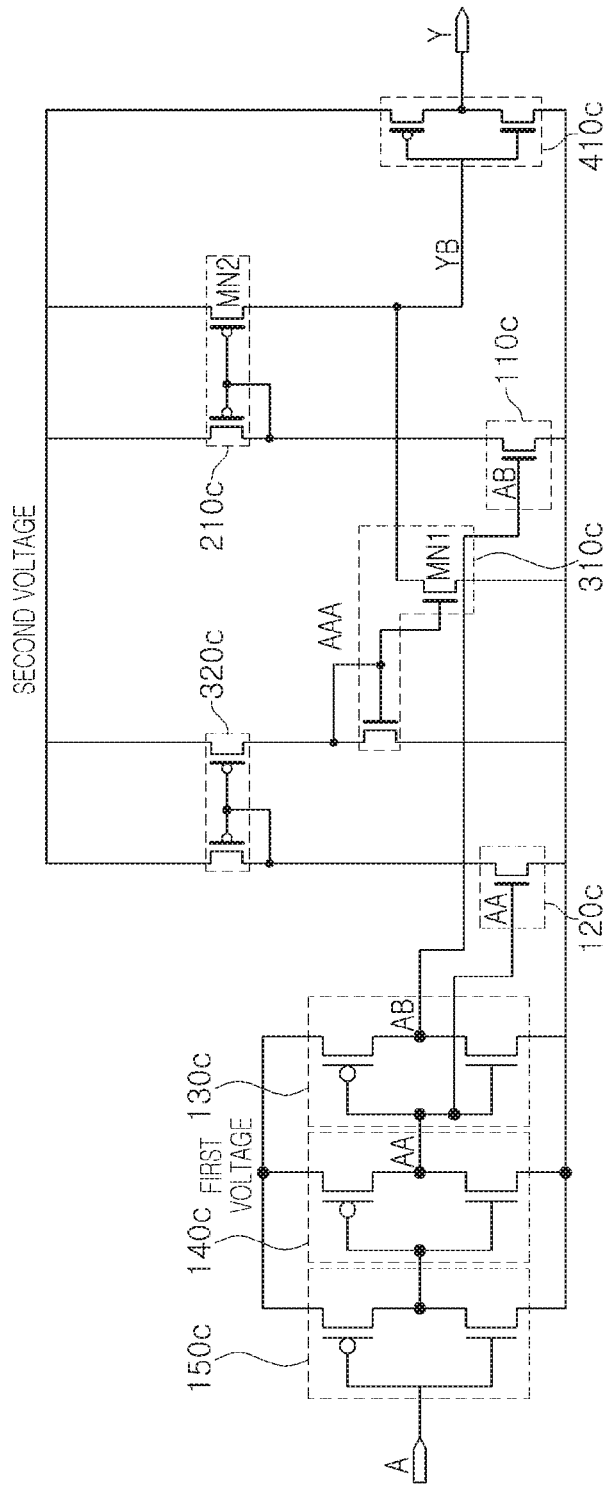
FIG. 6 is a circuit diagram illustrating a level shifter circuit according to another example embodiment.

FIG. 6 is a circuit diagram illustrating a level shifter circuit according to another example embodiment.

Referring to FIG. 6, the level shifter circuit may include at least one of a second semiconductor device 110c, a first semiconductor device 120c, a third inverter 130c, a second inverter 140c, a first inverter 150c, a second current mirror circuit 210c, a third current mirror circuit 310c, a first current mirror circuit 320c, and a second voltage-based inverter 410c.

That is, according to example embodiments, the second feedback circuit 510c, the first feedback circuit 520c, the third switch circuit 530c, the first switch circuit 540c, the fourth switch circuit 550c, and the second switch circuit 560c, illustrated in FIGS. 4 and 5, may be omitted.

Figure 7:
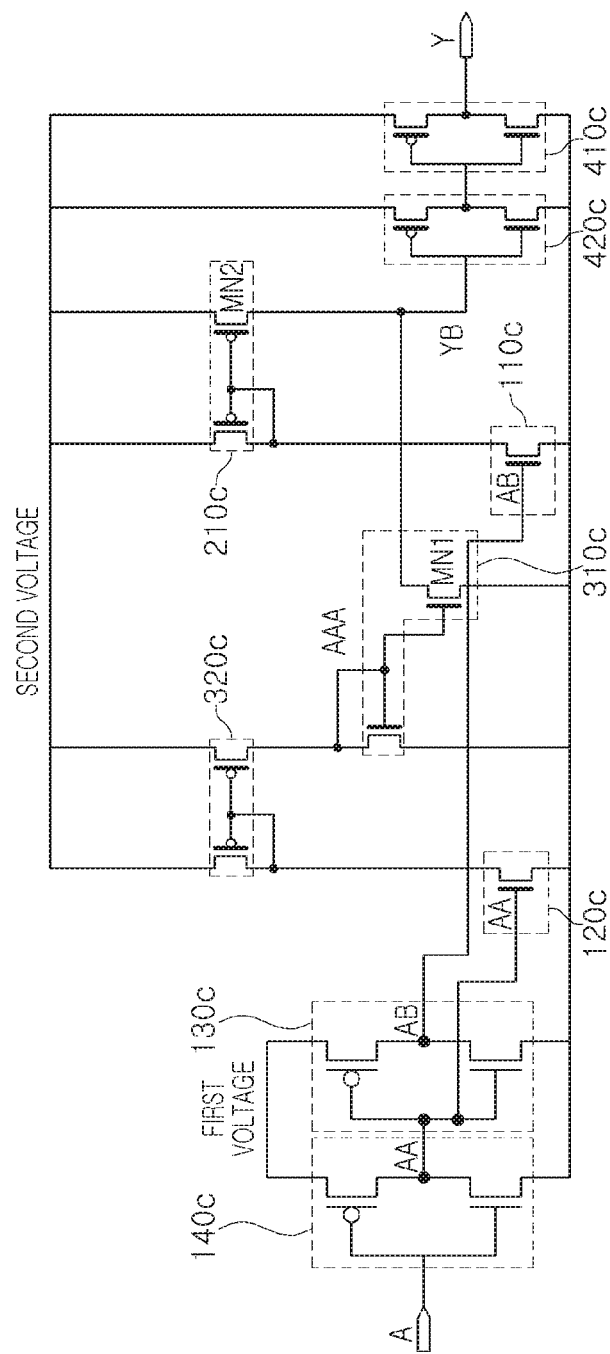
FIG. 7 is a circuit diagram illustrating a level shifter circuit according to another example embodiment.

FIG. 7 is a circuit diagram illustrating a level shifter circuit according to another example embodiment.

Referring to FIG. 7, the level shifter circuit may include at least one of a second semiconductor device 110c, a first semiconductor device 120c, a third inverter 130c, a second inverter 140c, a second current mirror circuit 210c, a third current mirror circuit 310c, a first current mirror circuit 320c, a second voltage-based inverter 410c, and a second voltage-based second inverter 420c.

That is, according to example embodiments, the first inverter 150c illustrated in FIGS. 5 and 6 may be omitted, and the second voltage-based second inverter 420c may be additionally arranged to match an inversion relationship of the output voltage Y according to the omission of the first inverter 150c.

The second voltage-based second inverter 420c may be additionally arranged to improve a driving force applied to a circuit receiving the output voltage Y. In this regard, the second voltage-based second inverter 420c may have a greater size (W/L) than the second voltage-based inverter 410c.

Figure 8:
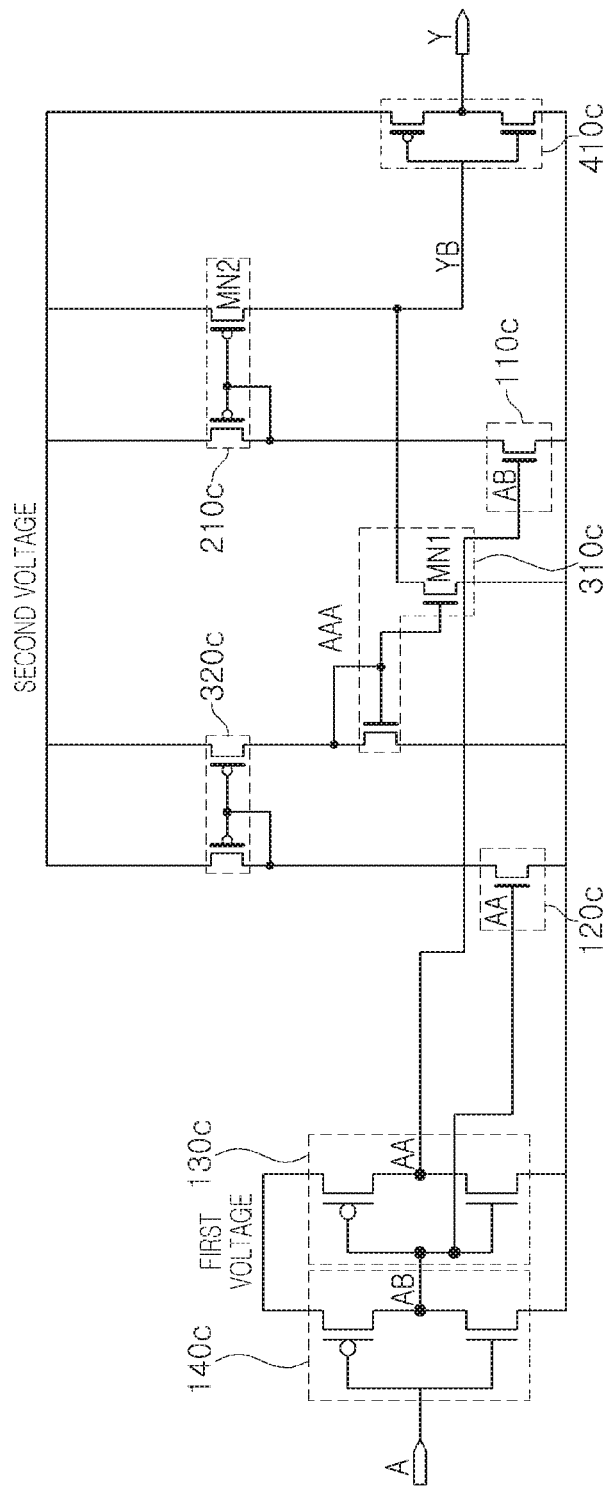
FIG. 8 is a circuit diagram illustrating a level shifter circuit according to another example embodiment.

FIG. 8 is a circuit diagram illustrating a level shifter circuit according to another example embodiment.

Referring to FIG. 8, the level shifter circuit may include at least one of a second semiconductor device 110c, a first semiconductor device 120c, a third inverter 130c, a second inverter 140c, a second current mirror circuit 210c, a third current mirror circuit 310c, a first current mirror circuit 320c, a second voltage-based inverter 410c, and a second voltage-based second inverter 420c.

That is, according to example embodiments, the second inverter 140c may generate a first voltage-based inverted voltage AB, and the third inverter 130c may generate a first voltage-based non-inverted voltage AA by inverting the first voltage-based inverted voltage AB.

Figure 9:
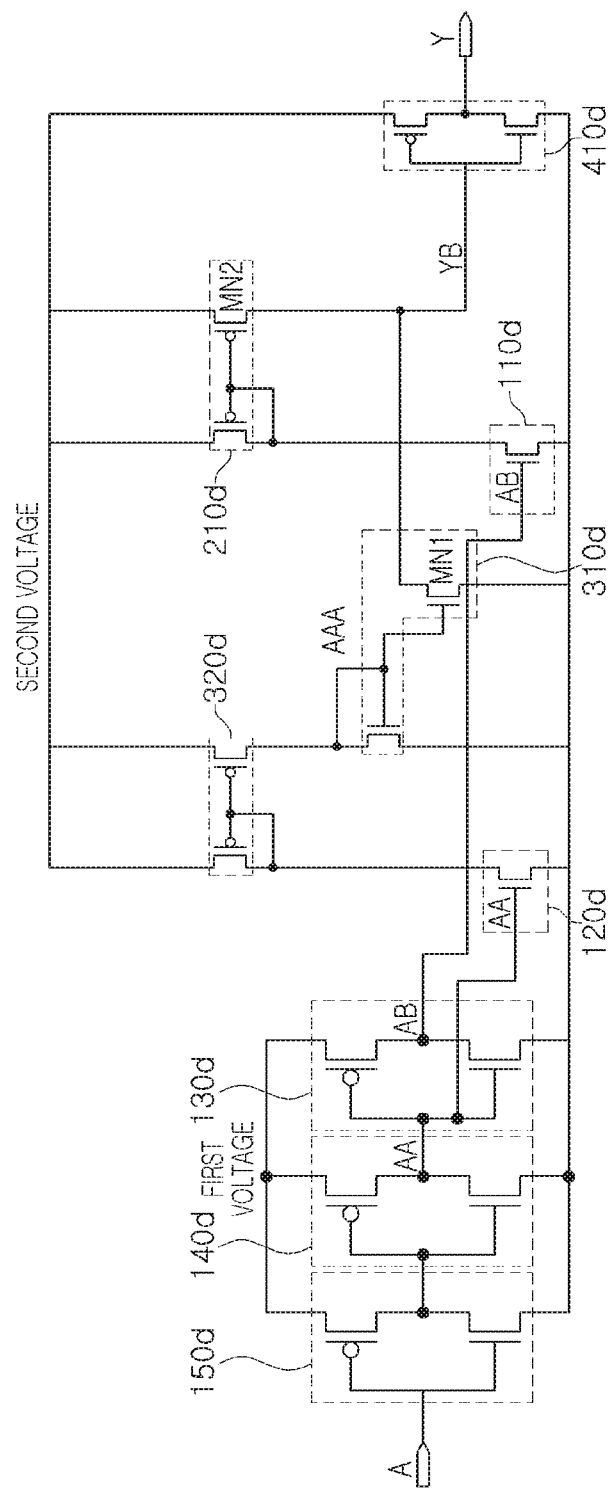
FIG. 9 is a circuit diagram illustrating a level shifter circuit according to another example embodiment.

FIG. 9 is a circuit diagram illustrating a level shifter circuit according to another example embodiment.

Referring to FIG. 9, the level shifter circuit may include at least one of a second semiconductor device 110d, a first semiconductor device 120d, a third inverter 130d, a second inverter 140d, a first inverter 150d, a second current mirror circuit 210d, a third current mirror circuit 310d, a first current mirror circuit 320d, and a second voltage-based inverter 410d.

That is, according to example embodiments, the second semiconductor device 110d, the first semiconductor device 120d, the third inverter 130d, the second inverter 140d, the first inverter 150d, the second current mirror circuit 210d, the third current mirror circuit 310d, the first current mirror circuit 320d, and the second voltage-based inverter 410d may have the same threshold voltage and the same gate thickness.

The second semiconductor device 110d, the first semiconductor device 120d, the second current mirror circuit 210d, the third current mirror circuit 310d, the first current mirror circuit 320d, and the second voltage-based inverter 410d may have a lower threshold voltage thereby requiring more current than the first semiconductor device 120c, the second current mirror circuit 210c, the third current mirror circuit 310c, the first current mirror circuit 320c, and the second voltage-based inverter 410c illustrated in FIGS. 4 to 8.

Figure 10:
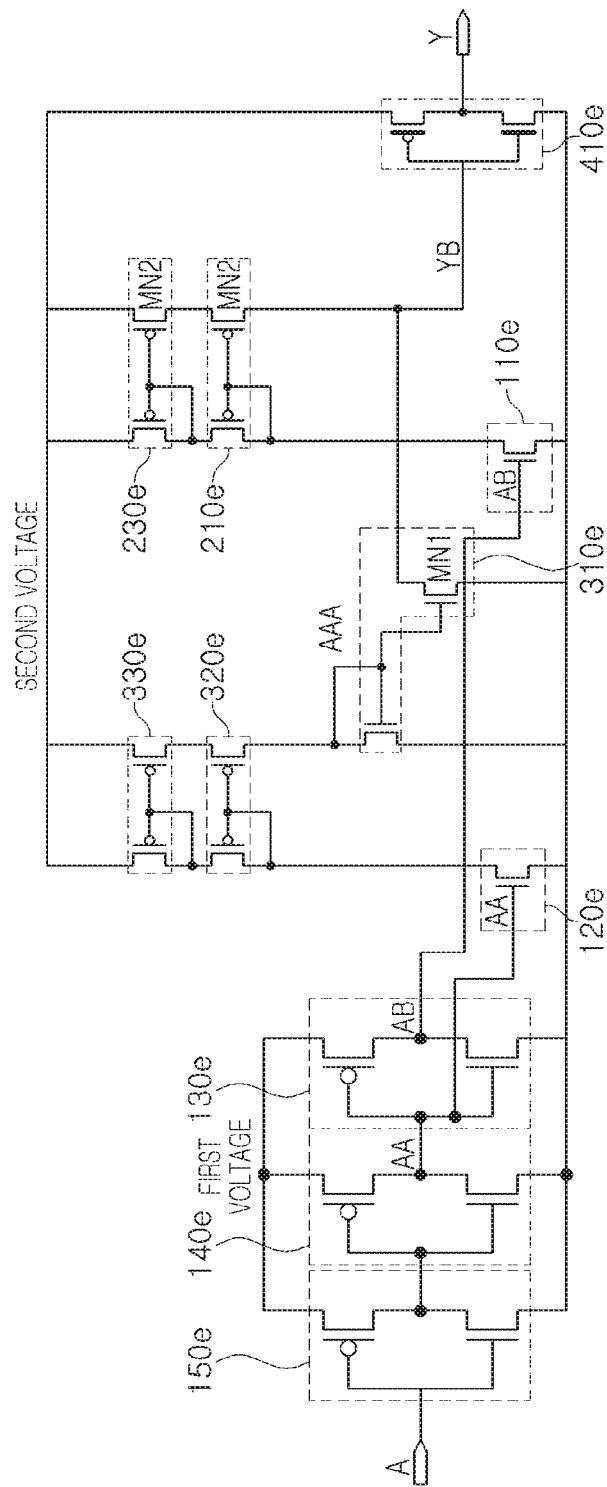
FIG. 10 is a circuit diagram illustrating a level shifter circuit according to another example embodiment.

FIG. 10 is a circuit diagram illustrating a level shifter circuit according to another example embodiment.

Referring to FIG. 10, the level shifter circuit may include at least one of a second semiconductor device 110e, a first semiconductor device 120e, a third inverter 130e, a second inverter 140e, a first inverter 150e, a second current mirror circuit 210e, a fourth current mirror circuit 230e, a third current mirror circuit 310e, a first current mirror circuit 320e, a fifth current mirror circuit 330e, and a second voltage-based inverter 410e.

That is, according to example embodiments, the fourth current mirror circuit 230e may form a cascade structure with the second current mirror circuit 210e, and the fifth current mirror circuit 330e may form a cascade structure with the first current mirror circuit 320e.

Accordingly, the second semiconductor device 110e, the first semiconductor device 120e, the second current mirror circuit 210e, the third current mirror circuit 310e, the first current mirror circuit 320e, and the second voltage-based inverter 410e may have the same threshold voltage as the third inverter 130e, the second inverter 140e, and the first inverter 150e, but consume less power than the third inverter 130e, the second inverter 140e, and the first inverter 150e.

The level shifter circuit according to example embodiments may be used in communication modules capable of exchanging data with an external electronic device through a wired communication interface such as USB, LAN, and micro-USB, or a wireless communication interface such as Wi-Fi, Bluetooth, NFC, infrared communication, and visible light communication, but is not limited thereto. For example, the level shifter circuit may be used in an image sensor control circuit, a display panel drive circuit, or a memory control circuit.

As set forth above, a level shifter circuit according to example embodiments can improve a time skew between pull-up and pull-down in an output signal, thereby reducing distortion in a waveform and duty ratio of the output signal.

While example embodiments have been shown and described above, it will be apparent to those skilled in the art that modifications and variations could be made without departing from the scope of the present disclosure as defined by the appended claims.

What is claimed is:

1. A level shifter circuit, comprising:
a first voltage-based input circuit configured to generate a first voltage-based inverted voltage and a first voltage-based non-inverted voltage based on an input voltage having a first voltage as a first peak voltage;
a pull-up circuit configured to generate a second voltage-based first current corresponding to the first voltage-based non-inverted voltage, generate a second voltage-based pull-up current based on the second voltage-based first current, and pull up an output voltage according to the second voltage-based pull-up current in a first state in which the first voltage-based non-inverted voltage increases; and
a pull-down circuit configured to generate a second voltage-based second current corresponding to the first voltage-based inverted voltage, generate a second voltage-based pull-down current based on the second voltage-based second current, and pull down the output voltage according to the second voltage-based pull-down current in a second state in which the first voltage-based inverted voltage increases,
wherein the pull-up circuit is further configured to generate the second voltage-based pull-up current by mirroring the second voltage-based first current at least once, and wherein the pull-down circuit is further configured to generate the second voltage-based pull-down current by mirroring the second voltage-based second current at least once.

2. The level shifter circuit of claim 1, wherein a first number of times that the pull-up circuit mirrors the second voltage-based first current is greater than a second number of times that the pull-down circuit mirrors the second voltage-based second current.

3. The level shifter circuit of claim 2, wherein the first voltage-based input circuit is further configured to generate the first voltage-based non-inverted voltage by inverting the input voltage at least twice, and generate the first voltage-based inverted voltage by inverting the first voltage-based non-inverted voltage at least once.

4. The level shifter circuit of claim 1, wherein the pull-down circuit comprises a second current mirror circuit configured to generate the second voltage-based pull-down current by mirroring the second voltage-based second current, and
wherein the pull-up circuit comprises a first current mirror circuit configured to generate a second voltage-based third current by mirroring the second voltage-based first current, and a third current mirror circuit configured to generate the second voltage-based pull-up current by mirroring the second voltage-based third current.

5. The level shifter circuit of claim 4, wherein the first voltage-based input circuit comprises:
a first inverter configured to generate an inverted input voltage by inverting the input voltage;
a second inverter configured to generate the first voltage-based non-inverted voltage by inverting the inverted input voltage; and
a third inverter configured to generate the first voltage-based inverted voltage by inverting the first voltage-based non-inverted voltage.

6. The level shifter circuit of claim 4, further comprising a second voltage-based output circuit configured to generate the output voltage from an inverted output voltage generated in accordance with at least one among the second voltage-based pull-up current and the second voltage-based pull-down current.

7. The level shifter circuit of claim 6, further comprising:
a first switch circuit configured to operate based on the output voltage and supply a second voltage to a first current mirror circuit input node when the output voltage decreases; and
a second switch circuit configured to operate based on the inverted output voltage and supply the second voltage to a second current mirror circuit input node when the inverted output voltage decreases.

8. The level shifter circuit of claim 7, further comprising:
a third switch circuit configured to operate based on the inverted output voltage and supply a low voltage to a third current mirror circuit input node when the inverted output voltage increases; and
a fourth switch circuit configured to operate based on the output voltage and supply the second voltage to an input node of the second voltage-based output circuit when the output voltage decreases.

9. The level shifter circuit of claim 6, further comprising:
a first feedback circuit configured to operate based on the inverted output voltage and increase a first current mirror circuit input node voltage when the inverted output voltage increases; and
a second feedback circuit configured to operate based on the output voltage and increase a second current mirror circuit input node voltage when the output voltage increases.

10. The level shifter circuit of claim 1, wherein the pull-up circuit comprises a first semiconductor device configured to receive the first voltage-based non-inverted voltage through a first semiconductor device gate terminal and generate the second voltage-based first current, and
wherein the pull-down circuit comprises a second semiconductor device configured to receive the first voltage-based inverted voltage through a second semiconductor device gate terminal and generate the second voltage-based second current.

11. The level shifter circuit of claim 10, wherein the first voltage-based input circuit includes a plurality of inverters configured to generate the first voltage-based inverted voltage and the first voltage-based non-inverted voltage,
   wherein a first semiconductor device threshold voltage is higher than threshold voltages of the plurality of inverters, and
   wherein a second semiconductor device threshold voltage is higher than the threshold voltages of the plurality of inverters.

12. The level shifter circuit of claim 1, wherein the first voltage-based input circuit is configured further to receive a first power having a first-voltage,
   wherein the pull-up circuit is further configured to receive a second power having a second voltage higher than the first voltage, and
   wherein the pull-down circuit is further configured to receive the second power having the second voltage.

13. The level shifter circuit of claim 1, wherein the input voltage oscillates in a first square wave form, and
   wherein the output voltage oscillates in a second square wave form.

14. A level shifter circuit, comprising:
   a first voltage-based input circuit configured to generate an inverted signal and a non-inverted signal based on an input signal having a first voltage as a first peak voltage;
   a first semiconductor device configured to receive the non-inverted signal through a first semiconductor device gate terminal and generate a first signal based on the non-inverted signal through a first semiconductor device drain terminal and a first semiconductor device source terminal;
   a second semiconductor device configured to receive the inverted signal through a second semiconductor device gate terminal and generate a second signal based on the inverted signal through a second semiconductor device drain terminal and a second semiconductor device source terminal; and
   a second voltage-based output circuit configured to generate a first mirror signal of the first signal and a second mirror signal of the second signal at least once and generate an output signal having a second voltage having a second peak voltage higher than the first peak voltage by collecting the first mirror signal and the second mirror signal.

15. The level shifter circuit of claim 14, wherein the second voltage-based output circuit is further configured to mirror the first signal a first number of times and mirror the second signal a second number of times, the first number of times being greater than the second number of times, and
   wherein the first voltage-based input circuit is further configured to generate the non-inverted signal by inverting the input signal at least twice and generate the inverted signal by inverting the non-inverted signal at least once.

16. The level shifter circuit of claim 14, wherein the second voltage-based output circuit is further configured to mirror the second signal a second number of times and mirror the first signal a first number of times, the second number of times being greater than the first number of times, and
   wherein the first voltage-based input circuit is further configured to generate the inverted signal by inverting the input signal at least twice and generate the non-inverted signal by inverting the inverted signal at least once.

17. The level shifter circuit of claim 14, further comprising:
   a first feedback circuit configured to feedback and correct the first signal based on at least one among the output signal and an inverted output signal of the output signal; and
   a second feedback circuit configured to feedback and correct the second signal based on at least one among the output signal and the inverted output signal of the output signal.

18. A level shifter circuit, comprising:
   a first voltage-based input circuit configured to generate a first voltage-based inverted voltage and a first voltage-based non-inverted voltage based on input voltage;
   a pull-up circuit configured to generate a second voltage-based first current corresponding to the first voltage-based inverted voltage, generate a second voltage-based pull-up current based on the second voltage-based first current, and pull up an output voltage according to the second voltage-based pull-up current in a first state in which the first voltage-based inverted voltage decreases; and
   a pull-down circuit configured to generate a second voltage-based second current corresponding to the first voltage-based non-inverted voltage, generate a second voltage-based pull-down current based on the second voltage-based second current, and pull down the output voltage according to the second voltage-based pull-down current in a second state in which the first voltage-based non-inverted voltage decreases,
   wherein the pull-up circuit is further configured to generate the second voltage-based pull-up current by mirroring the second voltage-based first current at least once, and wherein the pull-down circuit is further configured to generate the second voltage-based pull-down current by mirroring the second voltage-based second current at least twice.

19. The level shifter circuit of claim 18,
   wherein a first number of times that the pull-down circuit mirrors the second voltage-based second current is greater than a second number of times that the pull-up circuit mirrors the second voltage-based first current, and
   wherein the first voltage-based input circuit is further configured to generate the first voltage-based non-inverted voltage by inverting the input voltage at least twice, and generates the first voltage-based inverted voltage by inverting the first voltage-based non-inverted voltage at least once.

* * * * *